(12) United States Patent
Schravendijk et al.

(10) Patent No.: US 8,034,638 B1
(45) Date of Patent: *Oct. 11, 2011

(54) TREATMENT OF LOW K FILMS WITH A SILYLATING AGENT FOR DAMAGE REPAIR

(75) Inventors: Bart J. Schravendijk, Sunnyvale, CA (US); Justin F. Gaynor, Mountain View, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/437,437

(22) Filed: May 7, 2009

Related U.S. Application Data

(60) Continuation of application No. 11/476,426, filed on Jun. 27, 2006, now Pat. No. 7,541,200, which is a continuation-in-part of application No. 11/065,624, filed on Feb. 24, 2005, now Pat. No. 7,083,991, which is a division of application No. 10/056,926, filed on Jan. 24, 2002, now abandoned.

(51) Int. Cl.
H01L 21/00 (2006.01)
(52) U.S. Cl. .................................. 438/4; 257/E23.077
(58) Field of Classification Search .... 438/4, FOR. 434; 257/E23.077
See application file for complete search history.

(56) References Cited

U.S. PATENT DOCUMENTS

| | | |
|---|---|---|
| 4,768,291 A | 9/1988 | Palmer |
| 4,882,008 A | 11/1989 | Garza et al. |
| 5,171,393 A | 12/1992 | Moffat |
| 5,501,739 A | 3/1996 | Yamada et al. |
| 5,700,844 A | 12/1997 | Hedrick et al. |
| 5,789,027 A | 8/1998 | Watkins et al. |
| 6,114,186 A | 9/2000 | Jeng et al. |
| 6,140,226 A | 10/2000 | Grill et al. |
| 6,149,828 A | 11/2000 | Vaartstra |
| 6,306,564 B1 | 10/2001 | Mullee |
| 6,329,017 B1 | 12/2001 | Liu et al. |
| 6,329,062 B1 | 12/2001 | Gaynor |
| 6,391,932 B1 | 5/2002 | Gore et al. |
| 6,444,715 B1 | 9/2002 | Mukherjee et al. |
| 6,500,770 B1 | 12/2002 | Cheng et al. |

(Continued)

FOREIGN PATENT DOCUMENTS

EP 1-124-252 A2 8/2001

OTHER PUBLICATIONS

Gaynor, Justin F., "In-situ treatment of low-k films with a Silylating Agent After Exposure to Oxidizing Environments," U.S. Appl. No. 10/056,926, filed Jan. 24, 2002.

(Continued)

*Primary Examiner* — Michelle Estrada
(74) *Attorney, Agent, or Firm* — Weaver Austin Villeneuve & Sampson LLP

(57) ABSTRACT

The present invention provides methods of repairing damage to low-k dielectric film that is incurred by commonly used processes in IC fabrication. The methods may be integrated into an IC fabrication process flow at various stages. According to various embodiments, the methods of involve performing an IC fabrication process on a wafer on which a low-k film is deposited, and subsequently treating the film with a silylating agent to repair the damage done to the film during the process. Damage repair may be performed after one or more of the damaging process steps.

21 Claims, 5 Drawing Sheets

U.S. PATENT DOCUMENTS

| | | | |
|---|---|---|---|
| 6,537,896 | B1 | 3/2003 | Catabay et al. |
| 6,573,131 | B2 | 6/2003 | Yan et al. |
| 6,583,067 | B2 | 6/2003 | Chang et al. |
| 6,673,721 | B1 | 1/2004 | Kim et al. |
| 6,715,498 | B1 | 4/2004 | Humayun et al. |
| 6,846,380 | B2 | 1/2005 | Dickinson et al. |
| 6,943,121 | B2 | 9/2005 | Leu et al. |
| 7,083,991 | B2 | 8/2006 | Gaynor |
| 7,176,144 | B1 | 2/2007 | Wang et al. |
| 7,179,758 | B2 * | 2/2007 | Chakrapani et al. .......... 438/782 |
| 7,208,389 | B1 | 4/2007 | Tipton et al. |
| 7,541,200 | B1 | 6/2009 | Gaynor et al. |
| 2002/0123240 | A1 | 9/2002 | Gallagher et al. |
| 2002/0164877 | A1 | 11/2002 | Catabay et al. |
| 2002/0192980 | A1 | 12/2002 | Hogle et al. |
| 2003/0008518 | A1 | 1/2003 | Chang et al. |
| 2003/0066544 | A1 | 4/2003 | Jur et al. |
| 2003/0157248 | A1 | 8/2003 | Watkins et al. |
| 2003/0198895 | A1 | 10/2003 | Toma et al. |
| 2004/0096586 | A1 | 5/2004 | Schulberg et al. |
| 2004/0096672 | A1 | 5/2004 | Lukas et al. |
| 2004/0099952 | A1 | 5/2004 | Goodner et al. |
| 2004/0102031 | A1 | 5/2004 | Kloster et al. |
| 2004/0102032 | A1 | 5/2004 | Kloster et al. |
| 2004/0185679 | A1 | 9/2004 | Ott et al. |

OTHER PUBLICATIONS

U.S, Office Action for U.S. Appl. No. 10/056,926 mailed Feb. 6, 2003.
U.S, Final Office Action for U.S. Appl. No. 10/056,926 mailed Apr. 30, 2004.
U.S, Final Office Action for U.S. Appl. No. 10/056,926 mailed May 6, 2004.
U.S, Final Office Action for U.S. Appl. No. 10/056,926 mailed Dec. 10, 2004.
U.S, Final Office Action for U.S. Appl. No. 10/056,926 mailed Dec. 27, 2004.
Gaynor, Justin F., "Method of In-Situ Treatment of Low-K Films With a Silylating Agent After Exposure to Oxidizing Environments," U.S. Appl. No. 11/065,624, filed Feb. 24, 2005.
U.S, Final Office Action for U.S. Appl. No. 11/065,624 mailed Sep. 7, 2005.
Notice of Allowance for U.S. Appl. No. 11/065,624 mailed Feb. 16, 2006.
Gaynor, Justin F., "Treatment of Low K Films With a Silylating Agent for Damage Repair," U.S. Appl. No. 11/476,426, filed Jun. 27, 2006.
U.S, Office Action for U.S. Appl. No. 11/476,426 mailed Apr. 10, 2008.
Notice of Allowance for U.S. Appl. No. 11/476,426 mailed, Jan. 28, 2009.
Humayun et al., U.S. Appl. No. 10/404,693, filed Mar. 31, 2003.
Tipton et al., U.S. Appl. No. 10/672,305, filed Sep. 26, 2003.
U.S. Appl. No. 10/672,311, Office Action mailed Sep. 7, 2004.
U.S. Appl. No. 10/672,311, Office Action mailed Dec. 28, 2004.
U.S. Appl. No. 10/672,311, Final Office Action mailed Jul. 13, 2005.
U.S. Appl. No. 10/672,311, Office Action mailed Dec. 20, 2005.
U.S. Appl. No. 10/672,311, Notice of Allowance mailed May 22, 2006.
U.S. Appl. No. 10/672,311, Allowed Claims as of May 22, 2006.
U.S. Appl. No. 10/785,235, Office Action mailed Jul. 27, 2005.
U.S. Appl. No. 10/785,235, Final Office Action mailed Jan. 9, 2006.
U.S. Appl. No. 10/785,235, Office Action mailed May 30, 2006.
U.S. Appl. No. 10/785,235, Notice of Allowance mailed Oct. 3, 2006.
U.S. Appl. No. 10/785,235, Allowed Claims as of Oct. 3, 2006.
U.S. Appl. No. 10/672,305 (abandoned), Office Action mailed Mar. 22, 2005.
U.S. Appl. No. 10/672,305 (abandoned), Final Office Action mailed Sep. 1, 2005.
U.S. Appl. No. 10/672,305 (abandoned), Office Action mailed Feb. 7, 2006.
U.S. Appl. No. 10/672,305 (abandoned), Office Action mailed Jul. 12, 2006.
U.S. Appl. No. 10/672,305 (abandoned), Final Office Action mailed Feb. 2, 2007.
U.S. Appl. No. 10/404,693, Office Action mailed Mar. 15, 2005.
U.S. Appl. No. 10/404,693, Final Office Action mailed Aug. 24, 2005.
U.S. Appl. No. 10/404,693, Office Action mailed Feb. 28, 2006.
U.S. Appl. No. 10/404,693, Final Office Action mailed Sep. 8, 2006.
U.S. Appl. No. 10/404,693, Office Action mailed Aug. 14, 2007.
Cho et al., "Plasma Treatments for Molecularly Templated Nanoporous Silica Films" Electrochemical and Solid State Letters 4(4) G35-G38 (2001).

* cited by examiner

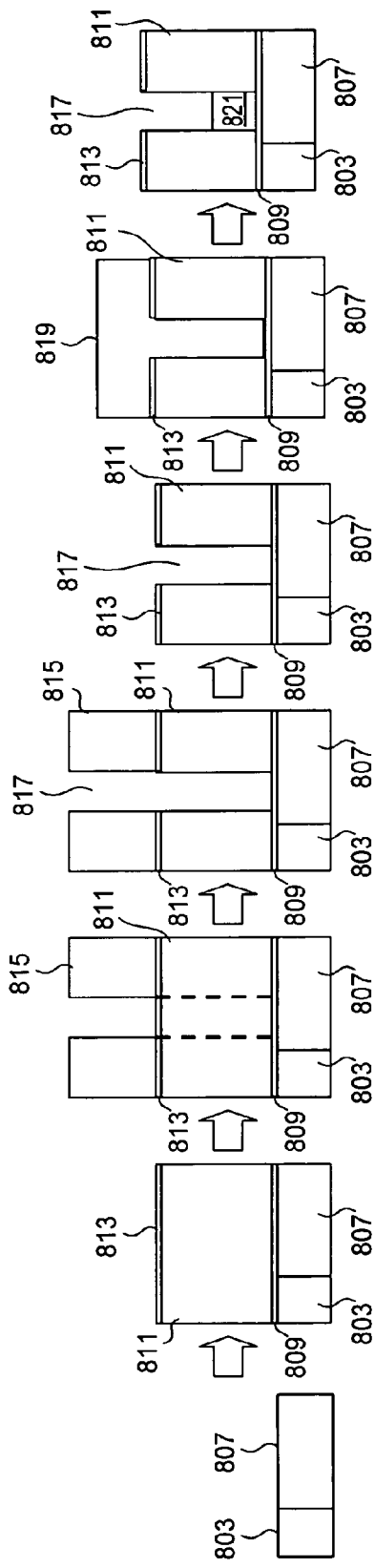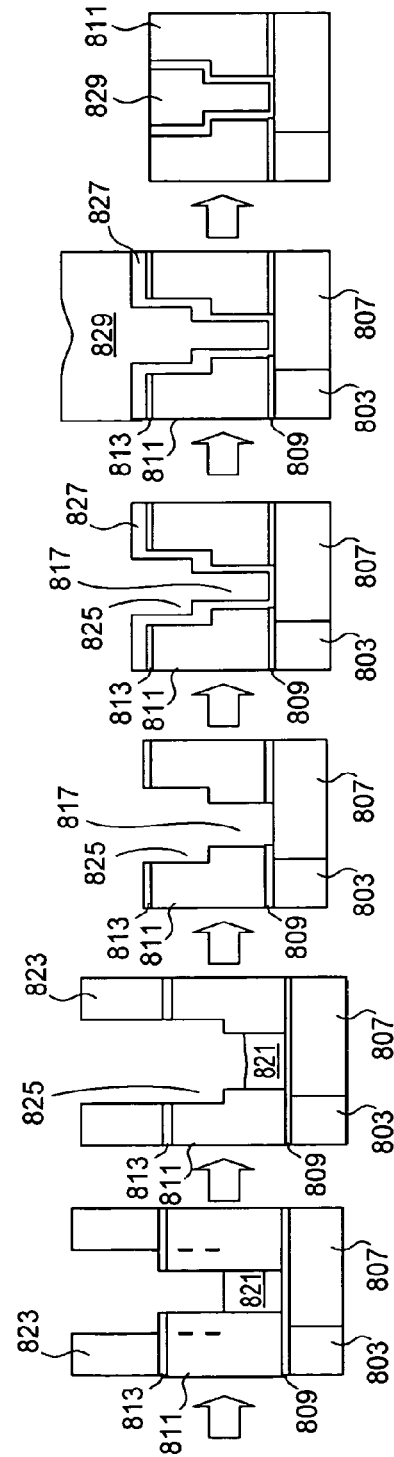

TREATMENT OF LOW K FILMS WITH A SILYLATING AGENT FOR DAMAGE REPAIR

CROSS REFERENCE TO RELATED APPLICATIONS

This application is a continuation of and claims priority to U.S. patent application Ser. No. 11/476,426, filed Jun. 27, 2006, titled, "TREATMENT OF LOW K FILMS WITH A SILYLATING AGENT FOR DAMAGE REPAIR," which in turn is a continuation-in-part of and claims priority to U.S. patent application Ser. No. 11/065,624, filed on Feb. 24, 2005, titled "IN-SITU TREATMENT OF LOW-K FILMS WITH A SILYLATING AGENT AFTER EXPOSURE TO OXIDIZING ENVIRONMENT," now U.S. Pat. No. 7,083,991, issued on Aug. 1, 2006, which in turn is a divisional of and claims priority to U.S. patent application Ser. No. 10/056,926, filed on Jan. 24, 2002, also titled "IN-SITU TREATMENT OF LOW-K FILMS WITH A SILYLATING AGENT AFTER EXPOSURE TO OXIDIZING ENVIRONMENT," all of which are incorporated herein by this reference for all purposes.

FIELD OF THE INVENTION

The present invention relates to the field of integrated circuit fabrication. More specifically, the present invention relates to methods for using a silylating agent to repair damage done to low-k dielectric films during fabrication process steps.

BACKGROUND

Increasing the speed and performance of integrated circuits ("ICs") typically calls for increasing the density of electronic components on the surface of a semiconductor wafer and increasing the speed at which the IC performs its functions. Increasing component density brings charge-carrying circuit elements closer together, thereby increasing the capacitive coupling (crosstalk) between such circuit elements and delay in the propagation of signals through the conductors. Higher capacitance is detrimental to circuit performance, especially for higher frequency operation as would typically be encountered in telecommunication applications and elsewhere.

One way of reducing capacitive coupling between proximate circuit elements is to reduce the dielectric constant ("k") of the insulator or insulating material(s) separating the coupled circuit elements by using low-k dielectric materials. The terms "low k dielectric materials" and "low-k dielectrics" are generally used to refer to dielectric materials with a dielectric constant less than that of silicon dioxide, which has a dielectric constant of about 3.9. Note that the term "low-k dielectric" applies to a material that has a low dielectric constant subsequent to processing; the material may have a higher dielectric constant upon deposition or during wafer processing. Although a number of low-k dielectric materials are available, they are susceptible to damage during many commonly used processes of IC fabrication. For example, oxidizing environments may be encountered during the ashing process and during curing. These oxidizing environments can damage the low-k dielectric film.

Ashing with an oxygen-containing plasma provides the highest ash rates, but is problematic when used in conjunction with many low-k dielectric materials. Low-k dielectrics include, for example, carbon-doped oxides, aerogels and xerogels, and mesoporous silica and silicalite films. However, these materials generally rely on a small percentage of Si—O-C or Si—C bonds to render them hydrophobic. During the ashing process, these bonds may be replaced by hydrophilic bonds, leading to absorption of water and an increase in dielectric constant. For example, hydrophobic Si—O—Si—$(CH_3)_3$ or Si—O—Si$(CH_3)_2$-O—Si bonds in the low-k dielectric material may be replaced by hydrophilic Si—OH bonds as a result of the action of the plasma during the ashing process.

In a reducing plasma, they may be replaced by Si—H bonds, which can subsequently convert to Si—OH bonds in the presence of water vapor. If hydrophilic bonds form, the low-k dielectric material may absorb water from the ambient after its removal from the ash chamber, which may increase its dielectric constant to unacceptable levels. Additionally, absorbed water vapor may desorb or "outgas" during subsequent high-temperature and/or low pressure processes, interfering with the process.

One approach to the problem is to use hydrogen- or ammonia-based chemistry rather than oxygen-based chemistry for the ash plasma. Hydrogen- and ammonia-based chemistries are more selective to the photoresist and therefore do not lead to a significant increase in dielectric constant. However, the ash rates of hydrogen- and ammonia-based chemistries are typically significantly lower than the ash rate using oxygen chemistry. For example, in a commercially available ash chamber running non oxygen-based chemistries, the ash rate may be decreased to about 25% or 30% of the ash rate using oxygen chemistry. Further, even these processes have been shown to be at least slightly detrimental to most low-k films.

A second process in which an oxidizing environment may be encountered is a cure step carried out after depositing the film on the substrate. Most low-k films undergo a cure step; that is, they undergo chemical reactions after deposition on the wafer to reduce the dielectric constant, stabilize the film, remove reaction byproducts or sacrificial materials, or any combination of these. Using an oxidizing environment would often be advantageous for the cure step. The oxidizing environment may be provided by increasing the temperature in the presence of oxygen or by providing an oxygen plasma. However, many low-k films are damaged during the cure step.

Other processes in which low-k films may be damaged in IC fabrication include during etch, CMP, strip, wet cleans and PVD processes. For example, during CMP in a copper damascene process, abrasive chemicals are used to planarize a top layer of low-k dielectric and inlaid copper lines. These chemicals may replace hydrophobic Si—O—Si—$(CH_3)_3$ or Si—O—Si$(CH_3)_2$-O—Si bonds in the low-k dielectric material with hydrophilic Si—OH bonds.

Therefore, it is desirable to provide methods for repairing damage to low-k films after various IC fabrication processes.

SUMMARY

The present invention meets these needs by providing methods of repairing damage to low-k dielectric film that is incurred by commonly used processes in IC fabrication. The methods may be integrated into an IC fabrication process flow at various stages. According to various embodiments, the methods involve performing an IC fabrication process on a wafer on which a low-k film is deposited, and subsequently treating the film with a silylating agent to repair the damage done to the film during the fabrication process. Damage repair may be performed after all, some or one of the damaging process steps.

According to one embodiment of the invention, a method of repairing damage to a low-k dielectric layer is provided. The method involves providing a low-k dielectric layer; performing one or more integrated circuit fabrication processes that damage the low-k dielectric layer; and subsequently performing a silylating process to repair at least some of the damage in the dielectric low-k dielectric layer.

Processes that damage the low-k layer include chemical cleans (wet or dry), chemical mechanical planarization, physical vapor deposition, photoresist ashing, sacrificial layer removal, cure and dielectric etch processes. The subsequent repair operation may be performed directly after the damaging process, or after subsequent additional processing steps. In a particular embodiment, a single repair operation may be used to repair damage resulting from multiple previous fabrication processes.

According to an embodiment of the invention, a chamber is configured to perform a process using an oxidizing environment on a wafer with a low-k dielectric layer and to subsequently perform a silylation process. Performing the silylation process in the same chamber as the process using an oxidizing environment prevents the low-k material from being exposed to air or other moisture-containing environment before silylation repairs the low-k material by replacing some hydrophilic bonds with hydrophobic bonds. Further, it reduces the number of chambers required for processing and reduces the processing time since wafers do not need to be transferred between two separate chambers.

According to an embodiment of the invention, the chamber includes an oxidizing agent inlet and a silylating agent inlet for providing oxidizing and silylating agents to a wafer in the chamber. The chamber may include a pump out port for evacuating the chamber. In an embodiment of the invention, the chamber may be included on a cluster tool. The cluster tool may include other modules, such as a wafer in/out module and one or more additional processing chambers.

According to an embodiment of the invention, the chamber is an ash/silylation chamber for performing in-situ silylation after ashing. The chamber includes an inlet for providing a silylating agent into the chamber after the ashing process has been completed. The ash/silylation chamber further includes an inlet for providing a gas for the plasma used in the ashing process. The ash/silylation chamber includes a pump port for evacuating the chamber after the ashing processing and/or after the silylating process.

According to an embodiment of the invention an ash/silylation chamber such as that described above is provided as part of a cluster tool. The cluster tool includes an in-out module through which wafers are introduced into the cluster tool. Additionally, the cluster tool includes a transfer chamber for moving wafers among modules in the cluster tool. The transfer chamber includes a wafer handling mechanism such as a robot to transport wafers among chambers in the cluster tool. In addition to the ash/silylation chamber, the cluster tool may include additional process modules. For example, the cluster tool may include an etch chamber, or a PECVD or spin-on deposition chamber for deposition of a cap layer.

According to an embodiment of the invention, the chamber is an etch/ash/silylation chamber which further includes an etch gas inlet for performing in-situ etching, ashing, and silylation on a wafer including a low-k dielectric layer. According to an embodiment of the invention, the etch/ash/silylation chamber is part of a cluster tool which may also include a wafer in/out module, transfer chamber, and wafer handling mechanism. The cluster tool may include additional chambers; for example, a PECVD or spin-on deposition chamber for deposition of a cap layer.

In an embodiment of the invention, the chamber is an organic removal/silylation chamber, where the oxidizing environment is used to cure a low-k material. A cluster tool including such an organic removal/silylation chamber may also include a wafer in/out module for introducing one or more wafers into the cluster tool. The cluster tool may include a deposition chamber, for example a PECVD chamber or a spin-on deposition chamber, for depositing a low-k layer. Further, the cluster tool may include a PECVD chamber or a spin-on deposition chamber for depositing a cap layer. Alternately, deposition of low-k layers and cap layers may be performed in the same chamber on the cluster tool.

According to an embodiment of the invention, a method for processing a wafer with a low-k dielectric layer includes performing silylation after a low-k material is exposed to an oxidizing environment; for example, during an ashing process or during a cure process.

According to an embodiment of the invention, silylation-is performed subsequent to ashing in order to repair damage to a low-k film caused by exposure to an oxidizing environment during the ashing process. The silylating agent repairs the damage to the low-k films after ashing is complete, thereby preventing a significant increase in dielectric constant due to water absorption. For example, a silylation process using the method and apparatus described here may be used to replace hydrophilic Si—OH bonds formed as a result of ashing with hydrophobic Si—O—Si—$(CH_3)_3$ or Si—O—Si$(CH_3)_2$—O—Si bonds.

The method and apparatus of embodiments of the current invention may be used with low-k dielectric films including hydrophobic porous oxide films. These films include, for example, silica aerogels, silica xerogels, silsesquioxanes including hydrisosilsesquioxane (HSQ) and methylsilsesquioxane (MSSQ), silicalite-based films, dendrite-based porous glass, and mesoporous silica. Additionally, embodiments of the invention may be used with carbon-doped oxides such as Coral™ or Black Diamond™. Silicalite-based low-k dielectric films are described in commonly assigned U.S. Pat. No. 6,329,062, "Dielectric Layer Including Silicalite Crystals and Binder and Method for Producing Same for Microelectronic Circuits," which is hereby incorporated by reference in its entirety. Additionally, methods of detemplating silicalites are described in the commonly assigned patent application entitled "Methods for Detemplating Zeolites and Silicalites for use in Integrated Circuit Manufacture," by Justin Gaynor and Patrick Van Cleemput, U.S. Pat. No. 6,660,245, which is hereby incorporated by reference in its entirety.

An embodiment of the invention includes a method for processing a substrate, where the method includes forming a low-k dielectric layer disposed over at least a portion of the substrate. A photoresist layer is formed over at least a portion of the low-k dielectric layer, with or without intervening layers between the low-k layer and the photoresist.

The photoresist is then patterned, and portions of the photoresist removed according to the patterning. For example, the photoresist is developed, thus removing portions of the photoresist. Portions of the low-k dielectric layer or an intervening layer between the low-k dielectric layer and the photoresist layer are exposed as a result of the patterning and removal of part of the photoresist layer.

One or more processing steps are then performed on the low-k dielectric layer. For example, the low-k dielectric layer may be etched through the patterned photoresist. Note that although the etching is performed through the patterned photoresist, the etching may affect portions of the low-k dielectric layer that lie beneath the remaining photoresist. For example, in an isotropic etch a substantial amount of low-k material beneath the remaining photoresist may be removed or damaged. Also, if the photoresist is isolated from the low-k material by an intervening layer and the etch process removes the intervening layer in the resist-free areas, the low-k film will be exposed during ashing.

Subsequent to a processing step such as an etch, the remaining photoresist is removed by an ashing process, which uses a plasma to remove the remaining photoresist. An oxygen plasma allows for a high ash rate, although the plasma may be formed from a number of other constituents, including hydrogen, ammonia, or forming gas. During the ashing process, a portion of the low-k dielectric layer may be damaged. Damage to the low-k dielectric layer includes the formation of hydrophilic bonds, which may absorb water and lead to an unacceptable increase in dielectric constant.

A silylating process is subsequently performed in order to repair at least some of the damage to the low-k dielectric material. The silylating process repairs the damage by replacing hydrophilic bonds with hydrophobic bonds. For example, Si—OH bonds may be replaced by Si—O—Si—$(CH_3)_3$ or Si—O—Si$(CH_3)_2$—O—Si. A number of silylating agents may be used, including hexamethyldisilazane (HMDS), dichlorodimethylsilane (DCDMS), chlorotrimethylsilane (CTMS), acetaldehyde, or combinations thereof.

BRIEF DESCRIPTION OF THE DRAWINGS

FIGS. 8A to 8M illustrate certain operations in a dual damascene copper process flow, including operations at which damage to low-k dielectrics may occur.

DETAILED DESCRIPTION

Figure 1:
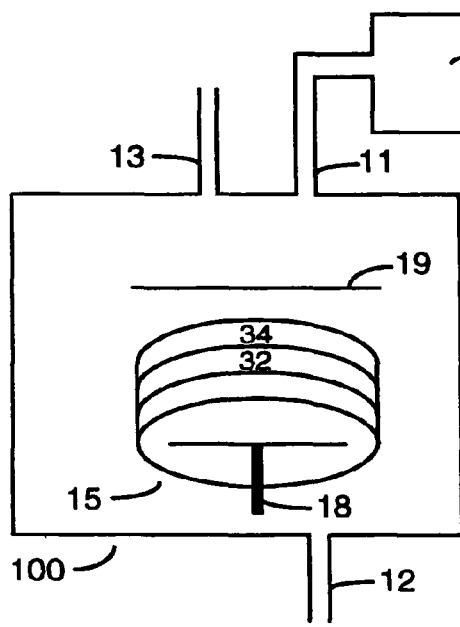
FIG. 1 shows an ash/silylation chamber according to an embodiment of the invention.

Low-k dielectric materials are susceptible to damage throughout the integrated circuit fabrication processes. These dielectric films typically rely on at least a small percentage of Si—O-$CH_3$ or Si—$CH_3$ to make them hydrophobic. Damage to the dielectric film often involves depletion of the methyl sites in the film. When exposed to oxidizing chemistries, the damage may involve replacing these methyl sites by hydrophilic Si—OH bonds. When exposed to reducing chemistries, the damage may involve replace these methyl sites by Si—H bonds. These subsequently convert to Si—OH bonds in the presence of water vapor. As indicated above, if unrepaired, the damage will cause the absorption of water and an increase in dielectric constant. Absorption of water may lead to a greater line to line leakage current, negatively impacting the reliability of the device. The film also becomes mechanically weaker. Damage during the process may occur at the surface and up to hundreds of angstroms below the surface.

The present invention relates to repairing damage to low-k dielectric film that is incurred during integrated circuit fabrication processes. The low-k film is repaired by treating the film with a silylating agent. Depleted methyl sites within the film are filled by a reaction with the silylating agent.

Embodiments of the current invention provide method and apparatus for using a silylating agent after exposure to an oxidizing environment in order to repair damage to low-k dielectric layers. In semiconductor processing, oxidizing environments may be encountered, for example, during the ashing process, during the cure process, during chemical mechanical planarization (CMP) processes and during wet or dry clean processes as well as during other processes.

In certain embodiments, the silylation process is performed in the same chamber as the fabrication process that damages the film. Performing the silylation process and the process using an oxidizing environment (or other process) in the same chamber prevents the low-k material from absorbing water from the environment before silylation renders the low-k material hydrophobic. Further, it reduces the number of chambers required for processing and reduces the processing time since wafers do not need to be transferred between two separate chambers. As explained above, materials used for low-k dielectric layers are referred to as "low-k" even though their dielectric constant may be higher than silicon dioxide as deposited or at some later time.

In certain embodiments, the repair process may be performed directly after the IC fabrication process that damages the film, in the same or a separate chamber. In other embodiments, additional processing steps may be performed prior to repairing the damage.

As indicated, low-k dielectric films are susceptible to damage at many common IC fabrication processing steps. FIGS. 8A-8M shows a via-first copper dual damascene process—an exemplary process flow during which damage to low-k films may occur. Damage to low-k films may occur at various stages of this process. One of skill in the art will understand that the process illustrated is an example of a process using low-k dielectric films, and that damage also occurs during comparable steps in other manufacturing processes involving low-k films. Examples of points at which repair of low-k dielectric film by treating the film with a silylating agent are generally indicated in the discussion of FIGS. 8A-8M, and more thoroughly below.

Presented in FIGS. 8A-8M, is a cross sectional depiction of a dual Damascene fabrication process. Referring to FIG. 8A, an example of a typical substrate used for dual damascene fabrication is illustrated. The substrate includes a pre-formed dielectric layer 803 (such as silicon dioxide or organic-containing low-k materials) with etched line paths (trenches and vias) in which a conductive copper line 807 has been inlaid. Typical metals for the conductive lines are aluminum and copper. More frequently, copper serves as the metal in damascene processes, as depicted in these figures. The resultant partially fabricated integrated circuit is a representative substrate for subsequent Damascene processing, as depicted in FIGS. 8B-8M. In certain embodiments, the pre-formed dielectric layer may be damaged from earlier process steps and the layer may be repaired at this point by treating it with a silylating agent. In a particular embodiment, the layer is repaired after a copper oxide reduction step.

As depicted in FIG. 8B, a silicon nitride or silicon carbide diffusion barrier 809 is deposited to encapsulate conductive lines 807. Next, a dielectric layer, 811, of a dual damascene dielectric structure is deposited on diffusion barrier 809. This is followed by deposition of a cap layer 813 (typically composed of silicon nitride or silicon carbide) on the first dielectric layer 811. Although not depicted in diagram dielectric layer 811 may include a first and second dielectric layers separated by an etch stop layer. This dual dielectric structure allows subsequent etching of the vias and trenches in the first and second dielectric layers (as discussed below).

The process follows, as depicted in FIG. 8C, wherein photoresist 815 has been deposited on the dielectric layer. FIG. 8C shows photoresist 815 after it has been developed to pattern the via opening. Standard lithographic techniques as discussed with regard to FIGS. 7A-7G are used. The dual Damascene process continues, as depicted in FIG. 8D with etch to create via 817 in dielectric layer 811 through to cap layer 809.

FIG. 8E shows the structure with the remaining photoresist 815 removed. As discussed further below, the photoresist is typically removed by an ash process in which the resist is exposed to a plasma. Low-k dielectric films are easily damaged during the plasma etch and ash processes. Plasma etch may result in methyl-site depletion below the surface of the unetched dielectric. Similarly, the plasma-based ash process may also damage the film. In some processes, a wet clean may be used instead of or in addition to the dry strip to remove photoresist and/or ash residue. Wet cleans typically use corrosive solvents to remove residue. Damage to low-k films may also occur at the this point in the process flow, as wet chemicals may also deplete methyl sites in the low-k film. Damage may be repaired at this point, prior to deposition of the next layer of photoresist.

After the photoresist and other etch or ash residue is removed, an Mine photoresist 819 is deposited the via opening as shown in FIG. 8F. The process continues in FIG. 8G, in which photoresist 819 has been etched back to form via plug 821. Via plug 819 fills a portion of via 817, e.g., about the level of the trench line depth.

The process continues in FIG. 8H, in which another layer of photoresist 823 is deposited and patterned to define the trench opening. Dielectric 811 is then etched to form trench 825, as shown in FIG. 8I. After the trench is formed, the photoresist is stripped as discussed above. Barrier material 809 in via 817 is removed to open the via to the underlying metal layer 807 in FIG. 8J. A wet clean process is typically performed at this point as well to remove strip and etch residue. As discussed above, the strip and wet clean processes are both able to damage the low-k dielectric film 811, which may be treated with a silylating agent at this point. A repair process may be performed here, prior to PVD.

Degassing is then performed remove any moisture or adsorbed gases from the wafer surface. After degassing, the wafer's surface features are cleaned to remove remaining contaminants. As a result of the lithography processes used to form the vias and trenches, contaminants lie in these features. This is particularly true in the bottom of the vias. These contaminants may comprise etch residues. As well, copper oxide may be present due to exposure of the copper inlay surfaces to atmospheric conditions between process steps. Techniques for cleaning the partially fabricated integrated circuit surface features typically involve a physical sputter etch using a noble gas plasma or a chemical cleaning method (a "dry clean"). These steps may also damage the low-k film. A repair process may also be performed here.

After cleaning, a metal barrier layer is deposited by a PVD process, though CVD and ALD methods may also be used. Via 817 and trench 825 are shown in FIG. 8K coated with barrier layer 827. A copper seed layer (not shown) is also deposited to provide a conductive layer for the subsequent copper electroplating ("electrofill") process. Via 817 and trench 825 are filled with copper using an electrofill process. This is shown in FIG. 8L, with copper 829 inlaid into the features. Copper lines 807 and 829 are now in electrical contact and form conductive pathways, as they are separated by only by a metallic diffusion barrier 827, which is itself conductive.

A chemical mechanical planarization (CMP) process is then performed to remove the excess copper and the portion of barrier layer 827 at the top of the stack and planarize the copper stack. CMP uses an abrasive chemical slurry that is contacted with the wafer using a polishing pad. Once the barrier is removed, the low k dielectric film is exposed to the slurry and may become damaged. The low k dielectric film is susceptible to both mechanical and chemical damage, though depletion of methyl sites is more likely to occur via chemical damage. The resulting planarized stack with copper conductive path 829 and exposed low-k dielectric 811 is shown in FIG. 8M. The film may be repaired at this point by exposure to the silylating agent.

Figure 9:
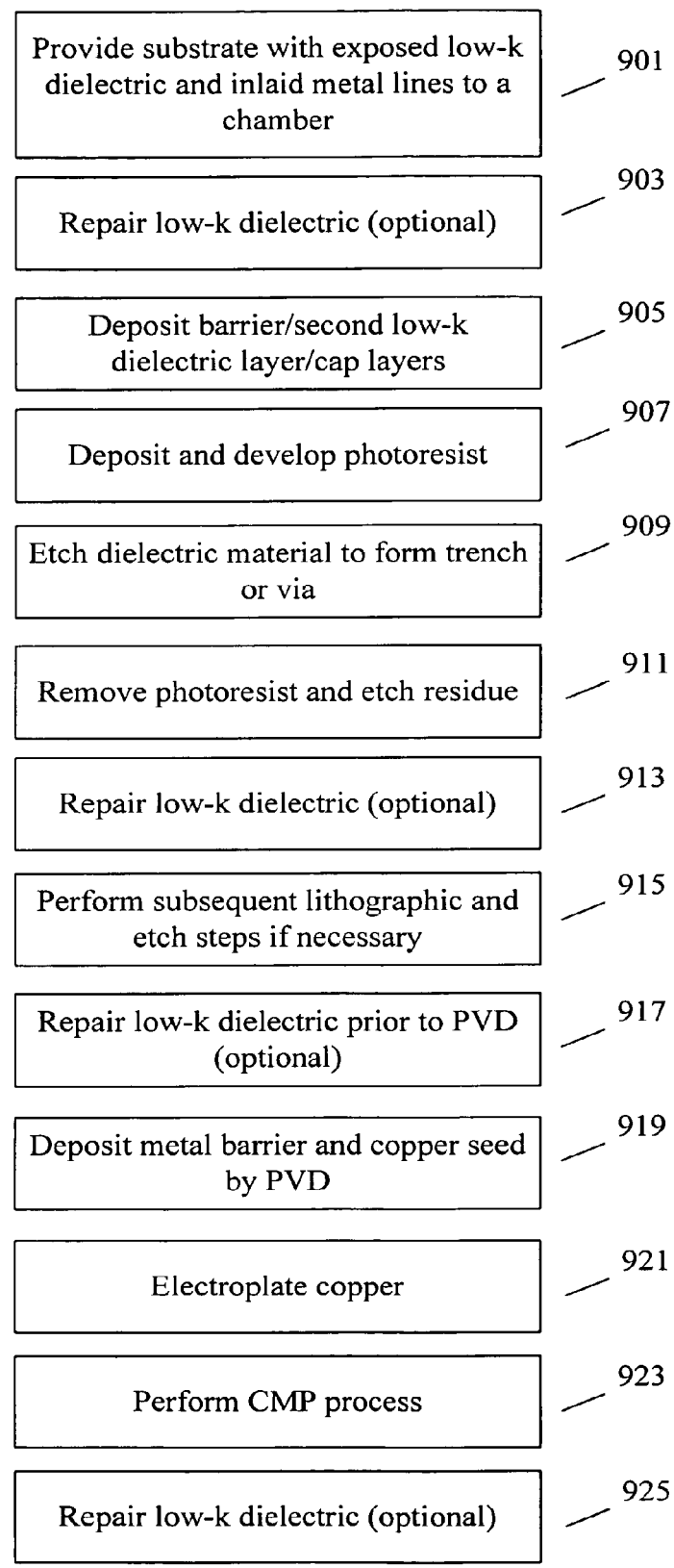
FIG. 9 is a process flow sheet showing operations in forming damascene structures according to certain embodiments of the invention.

FIG. 9 is a process flow sheet illustrating operations in an example of a damascene copper process flow that may be used in accordance with the present invention. First, in operation 901, the substrate is provided to a chamber. The substrate typically has exposed low-k dielectric and inlaid metal lines. In operation 903, an optional silylating treatment is performed, preferable after a copper oxide reduction. The chamber in which the silylating treatment is performed may be the same or a different chamber used for the subsequent deposition. Barrier/dielectric/cap layers are then deposited in operation 905. It should be noted that in many processes flows, cap layers such as cap layer 813 shown in FIG. 8B are used to protect the underlying dielectric film during subsequent processing operations. In certain embodiments, the dielectric film may undergo a repair process at a subsequent operation that may eliminate the need for such a cap layer. Photoresist is deposited and developed in operation 907 and the dielectric material is etched in operation 909. After etching the photoresist and etch residue is removed by ashing and/or a wet clean in operation 911. An optional low-k dielectric repair process is then performed in operation 913 to repair damage to the film done in operations 909 and/or 911. After the photoresist removal, subsequent lithographic and etch steps are performed if necessary in operation 915, for example, in dual damascene processes. An optional dielectric repair operation in then performed in operation 917, prior to deposition of the metal barrier and seed layers. Operation 917 may be performed prior to, after or between the degas and an optional dry clean operation that is typically performed prior to PVD. In certain embodiments, the repair may be performed after the clean to repair damage done during the plasma-based clean operation. (Plasma-based clean processes typically use either a reducing chemistry or argon ion bombardment. Both of these processes can deplete methyl sites.) In operation 919, PVD deposition of the metal barrier layer and copper seed layer occur. It should be noted that any silylating agent that is deposited on the underlying copper line (or reaction produce that forms on the underlying copper line) in step 917 may be removed by a sputter etch through to the copper after the first layer barrier layer is formed.

Pre-PVD repair operations may be performed in the same cluster tool as the PVD processes or in a separate chamber or tool to transfer to the PVD tool. Electrofilling is performed in operation 921 and CMP in operation 923. An optional repair is performed in operation 925, post-CMP. Although each of the individual repair operations is labeled optional, at least one repair process is performed. In certain embodiments, it is desirable to repair the film at multiple stages. In a particular embodiment, damage repair is performed after the dry clean and prior to the PVD process to repair damage done in all prior processes.

As indicated above, repairing the damaged film involves treating it with a silylating agent. Silylating agents include hexamethyldisilazane (HMDS), dichlorodimethylsilane (DCDMS), chlorotrimethylsilane (CTMS), and acetaldehyde. Di- and tri-functional silylating agents as described in Nitta et al. "Use of Difunctional Silylation Agents for Enhanced Repair of Damaged Porous Low-k Dielectrics", herein incorporated by reference may also be used.

In operation, treating the low-k film with a silylating agent involves introducing the silylating agent into a chamber housing the wafer. For example, the agent may be introduced using an inexpensive fixed-pressure carrier gas and bubbler system. Alternately, a more expensive mass flow controller may be used. In an embodiment of the invention, HMDS vapor is used as a silylating agent, which may be provided to the chamber via a fixed pressure carrier gas and bubbler as follows: 100% HMDS is stored in a glass vessel in liquid form. A nitrogen line is immersed in the HMDS, and nitrogen carrier gas flows into the HMDS vessel. Alternately, another non-reactive gas such as helium or argon could be used. The nitrogen carrier gas bubbles through the liquid HMDS. A second line leads from the HMDS vessel to the chamber that contains the wafer. This flow includes nitrogen with a percentage of HMDS vapor, which contacts the dielectric film. The process is performed for a specified period of time. Although the minimum process time for effective silylation may be less than about ten minutes, ten minutes is typically sufficient.

An example of chamber that may be used for silylation is depicted in FIG. 1, discussed below. Chambers may be used to perform silylation only, or in certain embodiments, chambers used for other IC fabrication processes are also used to perform silylation treatment. For example, FIG. 1 shows an ash/silylation chamber. Silylation treatments may be performed in other chambers, e.g., PECVD chambers used to deposit dielectric film. Examples of various fabrication processes that employ post-process silylating treatment are given below.

An embodiment of the invention includes a chamber for using an oxidizing environment for plasma photoresist removal and subsequently performing a silylation process, such as ash/silylation chamber 100 of FIG. 1. A wafer 15 may be positioned on a pedestal 18 inside an ash/silylation chamber 100. A low-k dielectric layer 32 is disposed on wafer 15. In some embodiments, low-k dielectric layer 32 is disposed directly on wafer 15, while in some embodiments there are one or more intervening layers between wafer 15 and low-k dielectric layer 32. Low-k dielectric layer 32 on wafer 15 has been processed; for example, a photoresist layer 34 has been applied and patterned, and portions of low-k dielectric layer 32 have been removed by an etch process. Photoresist layer 34 is disposed above low-k dielectric layer 32. It may be disposed directly on low-k dielectric layer 32, or there may be one or more intervening layers. Low-k dielectric materials that may be used for embodiments of the invention include aerogels, xerogels, porous silsesquioxanes including methylsilsesquioxane (MSSQ) and hydrisosilsesquioxane (HSQ), silicalite-based films, dendrite-based porous glass, and mesoporous silica. Additionally, embodiments of the invention may be used with carbon-doped oxides such as Coral™ After processing, the remainder of photoresist layer 34 may be removed in ash/silylation chamber 100.

Ash/silylation chamber 100 includes an inlet for providing an oxidizing agent into ash/silylation chamber 100, such as plasma gas port 11. Pedestal 18 is heated and maintained at a temperature of 30-250.degree. C. The plasma gas is introduced at a reduced pressure; that is, below atmospheric pressure. For example, pressures in the range of 200-2000 mtorr may be used. The plasma may be an oxygen-containing plasma for increased ash rates. In other embodiments, the plasma may be a reducing plasma: for example, a hydrogen-containing plasma, an ammonia-containing plasma, or a forming gas plasma. The plasma is formed by well-known methods. For example, the plasma may be formed by microwave techniques or by radiofrequency (RF) electrical field techniques in an upstream plasma generator 2. Alternately, a plasma may be produced in the vicinity of wafer 15 by providing a voltage between pedestal 18 and an upper electrode 19. Ash/silylation chamber 100 is held at a reduced pressure and oxygen is introduced either above upper electrode 19 or through holes in upper electrode 19. According to well-known methods, a plasma is generated when an appropriate electric field is maintained between pedestal 18 and upper electrode 19.

The remaining portions of photoresist layer 34 are removed in ash/silylation chamber 100 and residual byproducts are pumped out of ash/silylation chamber 100 through a pump port 12. Low-k dielectric layer 32 may be damaged due to the action of the plasma. For example, hydrophilic bonds such as Si—OH may replace hydrophobic bonds such as Si—O—Si—$(CH_3)_3$ or Si—O—Si$(CH_3)_2$-O—Si bonds. After the plasma is discontinued, a silylating agent is added through a separate silylating agent inlet such as silylating port 13 to repair damage to low-k dielectric layer 32. A separate silylating port is used in order to prevent mixing of the silylating agent with the gas used to form the plasma. The silylating agent is introduced into ash/silylation chamber 100 using an inexpensive fixed-pressure carrier gas and bubbler system. Alternately, a more expensive mass flow controller may be used. Further, since most silylating agents are toxic, embodiments of the invention use double containment of the silylating agent for safety.

In an embodiment of the invention, HMDS vapor is used as a silylating agent, which is provided into ash/silylation chamber 100 using a fixed pressure carrier gas and bubbler as follows. 100% HMDS is stored in a glass vessel in liquid form. A nitrogen line with a pressure of about 5 psi above atmospheric is immersed in the HMDS, and a flow of 500 cc/min of nitrogen carrier gas flows into the HMDS vessel. Alternately, another non-reactive gas such as helium or argon could be used. The nitrogen carrier gas bubbles through the liquid HMDS. A second line leads into ash/silylation chamber 100, which includes wafer 15. Because the pressure in the HMDS vessel will be approximately constant, a flow of about 500 cc/min flows into ash/silylation chamber 100. This flow includes nitrogen with an unknown percentage of HMDS vapor.

The pressure in ash/silylation chamber 100 is held at about 5 ton below atmospheric pressure in order to ensure that reactive byproducts are pumped out through an abatement system rather than leaking from ash/silylation chamber 100. A simple Venturi pump may be used for this purpose. The process is performed for about ten minutes at room temperature. Although the minimum process time for effective silylation may be less than ten minutes, ten minutes is sufficient. Low-k dielectric layers on wafers processed using this embodiment of the invention had dielectric constants close to their pre-ash levels and significantly reduced below post-ash levels.

Pressures of about 5 torr below atmospheric pressure may be used for silylation. Other pressures may be used. In order to change the pressure, the flow of silylating vapor may be changed, more or less carrier gas may be provided, or the vacuum line of pump port 12 may be throttled to increase or decrease the rate material is pumped out through pump port 12. After silylation is complete, ash/silylation chamber 100 may be pumped out through pump port 12. These process conditions are not limited to post-ashing silylation but may be used for other repair operations.

In another embodiment, additional steps are performed after silylation. After silylation, wafer 15 is immersed in a post-etch clean bath including Ashland Chemical's proprietary NE-14 solution, which is composed mostly of water, ammonia, and hydrogen peroxide. Subsequently, a second silylation process is performed using HDMS to further repair damaged bonds.

In other embodiments, a commercial silylation process may be used. For example, HMDS vapor may be provided to a wafer held at 200 C, for a period of 20 seconds. The higher temperature used in this process enables the process time to be reduced. Alternatively, a commercial process which employs a solution of 1% HMDS in xylene may be used. The solution is spun onto the wafer; that is, dispensed while the wafer is rotating at a rate of 50-100 rpm, and allowed to dry.

An embodiment of the invention includes a chamber for etching, for processing a wafer in an oxidizing environment, and for subsequently performing a silylation process, such as etch/ash/silylation chamber 110 of FIG. 2. Etch/ash/silylation chamber 110 includes plasma gas port 11, pump port 12, and an inlet for providing an etchant to etch/ash/silylation chamber 110 such as etch gas port 14, so that etching, ashing, and silylation may all be performed in a single chamber.

An embodiment of the invention includes a chamber for using an oxidizing environment to perform a cure process and for subsequently performing a silylation process, such as an organic removal/silylation chamber 120 of FIG. 3. Organic removal/silylation chamber 120, like ash/silylation chamber 100, includes pedestal 18 for supporting and heating a wafer, plasma gas port 11, silylating port 13, and pump port 12.

Many low-k films and processes employ a sacrificial material within a matrix. For example, a material comprising a thermally labile organic group within a thermally stable inorganic matrix may be used to form a low-k dielectric layer. After the film is deposited, the sacrificial material is removed. The remaining material has a low dielectric constant. The sacrificial material may-be removed by an oxidizing atmosphere. This could be a reduced-pressure environment in which an oxygen-containing plasma is generated, or a reduced-pressure environment downstream from such a plasma. It could be a high-temperature environment in which oxygen is present. The wafer is held in the oxidizing atmosphere until the low-k material cures; that is, until the material undergoes the chemical reactions to render the film thermally, chemically, and mechanically stable, and until substantially all byproducts, sacrificial moieties, and other undesired species are removed from the material. For example, one undesired species that may be removed is quaternary ammonia molecules from silicalite, as described in "Methods for Detemplating Zeolites and Silicalites for use in Integrated Circuit Manufacture," supra. After the low-k material is exposed to the oxidizing environment, silylation is performed to render the film hydrophobic.

According to an embodiment of the invention, wafer 15 includes low-k dielectric layer 32, which may be formed directly on the surface of wafer 15, or there may be intervening layers. Low-k dielectric layer 32 is formed from a material using a sacrificial material within a matrix. For example, the sacrificial material is a thermally labile organic material and the matrix is an inorganic matrix. One sacrificial material that may be used is polymeric dendrite in dendrimer glass. In order to remove the sacrificial material, oxygen or an oxygen plasma is provided through plasma gas port 11. The plasma is formed by well-known methods. For example, the plasma may be formed by microwave techniques or by radiofrequency (RF) electrical field techniques in an upstream plasma generator 2. The active species created in the plasma oxidize the organic molecules and break the large organic molecules into volatile fragments which are pumped away. Wafer 15 may also be heated by heating pedestal 18, for more effective organic removal. After removal of the organic material, silylation is performed. A silylating agent is provided through silylating port 13 as described above.

In certain embodiments, silylating treatments repair damage done via CMP processes. Use of the repair process obviates the need for a cap layer (e.g., a silicon dioxide cap) to protect the dielectric film during CMP. This results in better device performance as such cap layers have higher k values than low-k films. CMP processes often are multi-step processes in which the bulk of the copper (or other metal) is removed, followed by a step in which the barrier layer is removed. This may be followed by a step in which the dielectric film is buffed. Damage to the low k dielectric film is likely to happen in these latter steps. As indicated above, although CMP may result in both mechanical and chemical damage to a low-k dielectric, chemical damage is more likely to result in the methyl-site depletion. Silylating treatment to repair this damage may occur after the CMP process, or after a post-CMP clean. In certain embodiments, the silylating treatment may be performed in the CVD or other chamber in which the subsequent barrier or dielectric layer is deposited prior to deposition of that layer.

In certain embodiments, a silylating treatment is used to repair damage done by wet cleaning. Wet cleaning chemistries are selected based on the solubility of the contaminants; exposure to various the oxidizing and reducing chemistries may damage the low-k dielectric as discussed above. Wet cleans are commonly used after ashing and after CMP. Conventional wet cleaning processes are limited by the chemistries that cause relatively little damage to the low-k film. Use of a repair step after wet cleaning allows a broader range of wet clean chemistries to be considered.

Figure 4:
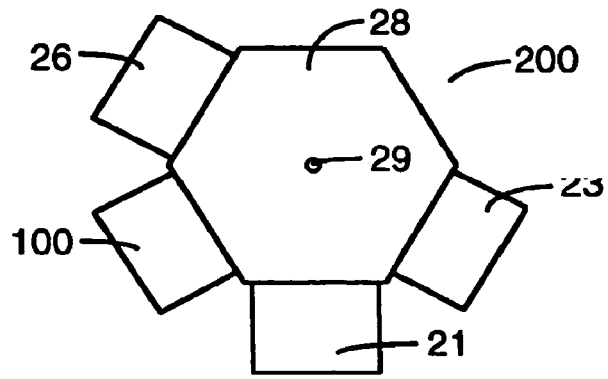
FIG. 4 shows a cluster tool including an ash/silylation chamber such as that shown in FIG. 1 according to an embodiment of the invention.

FIG. 4 shows an embodiment of a cluster tool 200. A cluster tool 200 includes a plurality of chambers, including a wafer in/out module 21 and an ash/silylation chamber such as ash/silylation chamber 100 of FIG. 1. By providing a cluster tool having an ash/silylation chamber, the wafer may be processed and ash damage repaired efficiently. Further, damage to a low-k material may be repaired before any exposure to an atmosphere which contains moisture.

A transfer chamber 28 includes a wafer handling mechanism such as a robot 29 that can move one or more wafers (not shown) in cluster tool 200. Etched wafers with patterned photoresist remaining on portions of the surface may be introduced into cluster tool 200 through wafer in/out module 21. Robot 29 moves a wafer from in/out module 21 through transfer chamber 28 to ash/silylation chamber 100. An ashing process is performed as described above, substantially removing the remaining photoresist. After the ash is complete, a silylating agent is introduced into ash/silylation chamber 100, repairing at least some of the damage caused by the ash. Subsequently, the wafer or wafers may be moved by robot 29 through transfer chamber 28 to another processing module on the cluster tool such as a first process module 23 or a second process module 26 or to wafer in/out module 21.

In an embodiment of the invention, cluster tool 200 includes wafer in/out module 21, ash/silylation chamber 100, and first process module 23. First process module 23 may be an etch module, a PECVD module for depositing a cap layer, a spin-on deposition module for depositing a cap layer, or other module. In an embodiment of the invention, first process module 23 is an etch chamber. For an embodiment where first process module 23 is an etch chamber, wafers with patterned photoresist are introduced into cluster tool 200 through wafer in/out module 21. Robot 29 moves one or more wafers from wafer in/out module 21 through transfer chamber 28 to first process module 23, where an etch is performed. After the etch is complete, robot 29 moves the wafers through transfer chamber 28 to ash/silylation chamber 100. An ashing process is performed as described above, substantially removing the remaining photoresist. After the ash is complete, a silylating agent is introduced into ash/silylation chamber 100, repairing at least some of the damage caused by the ash. Subsequently, the wafer or wafers may be moved by robot 29 through transfer chamber 28 to another processing module on the cluster tool such as second process module 26 or to wafer in/out module 21.

In an embodiment of the invention, first process module 23 of FIG. 4 may be configured to perform both an ashing process and an etching process. After the etch is performed in first process module 23, residual photoresist is removed by ashing in first process module 23. In this embodiment, after the ashing is complete, robot 29 moves the wafers through transfer chamber 28 to ash/silylation chamber 100. A silylating agent is introduced into ash/silylation chamber 100, repairing at least some of the damage caused by the ash. Subsequently, the wafer or wafers may be moved by robot 29 through transfer chamber 28 to another processing module on the cluster tool such as second process module 26 or to wafer in/out module 21.

In an embodiment of the invention, cluster tool 200 of FIG. 4 includes ash/silylation chamber 100, wafer in/out module 21, first process module 23, and second process module 26. Second process module 26 may be an etch chamber, a PECVD module for depositing a cap layer, a spin-on deposition module for depositing a cap layer, or other module. In an embodiment of the invention, first process module 23 is an etch chamber and second process module 26 is a PECVD deposition chamber for depositing a cap layer.

One or more wafers with patterned photoresist is introduced into cluster tool 200 through wafer in/out module 21. Robot 29 moves a wafer from wafer in/out module 21 through transfer chamber 28 to first process module 23, where it is etched. Robot 29 then moves the wafer through transfer chamber 28 to ash/silylation chamber 100, where ashing and then silylation are performed as described above. Robot 29 then moves the wafer through transfer chamber 28 to second process module 26, where a cap layer is deposited using PECVD methods. Subsequently, the wafer may be moved by robot 29 through transfer chamber 28 to another processing module on the cluster tool (not shown) or to wafer in/out module 21.

Figure 2:
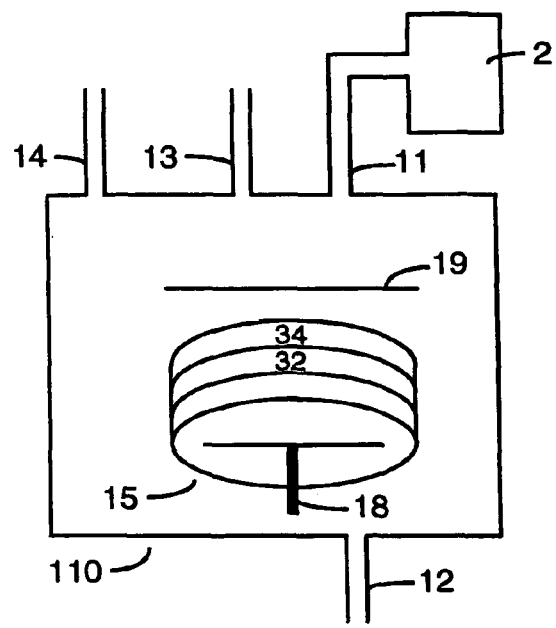
FIG. 2 shows an etch/ash/silylation chamber according to an embodiment of the invention.
Figure 5:
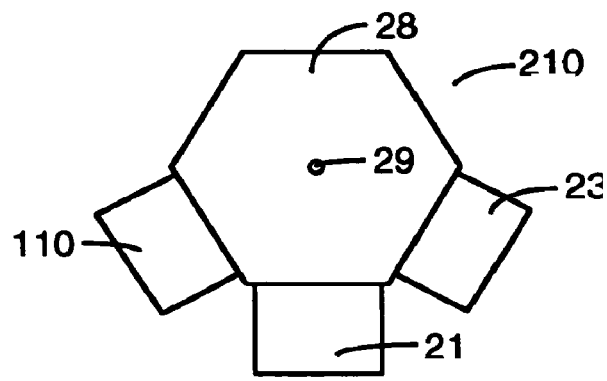
FIG. 5 shows a cluster tool including an etch/ash/silylation chamber such as that shown in FIG. 3 according to an embodiment of the invention.

FIG. 5 shows a cluster tool 210 with an etch/ash/silylation chamber such as etch/ash/silylation chamber 110 of FIG. 2, according to an embodiment of the invention. Cluster tool 230 may include additional process modules such as first process module 23. In an embodiment of the invention, cluster tool 230 includes etch/ash/silylation chamber 110 and wafer in/out module 21. One or more wafers are introduced into cluster tool 210 through wafer in/out module 21. Robot 29 moves a wafer through transfer chamber 28 to etch/ash/silylation chamber 110. The wafer is first etched. After etching, the remaining photoresist is removed by ashing. Subsequently, silylation is performed. The wafer may then be moved by robot 29 through transfer chamber 28 to another module such as first process module 23 for further processing or to wafer in/out module 21.

In an embodiment of the invention, cluster tool 210 of FIG. 5 includes etch/ash/silylation chamber 110, wafer in/out module 21, and first process module 23. First process module 23 may be a PECVD module for depositing a cap layer, a spin-on deposition module for depositing a cap layer, or other module. In an embodiment of the invention, first process module 23 is a PECVD module for depositing a cap layer. One or more wafers are introduced into cluster tool 210 through wafer in/out module 21. Robot 29 moves a wafer through transfer chamber 28 to etch/ash/silylation chamber 110. The wafer is first etched. After etching, the remaining photoresist is removed by ashing. Subsequently, silylation is performed. The wafer is then moved by robot 29 through transfer chamber 28 to first process module 23, where a cap layer is deposited using PECVD methods. Subsequently, the wafer is moved by robot 29 through transfer chamber 28 to another process module (not shown) for further processing or to wafer in/out module 21.

Figure 3:
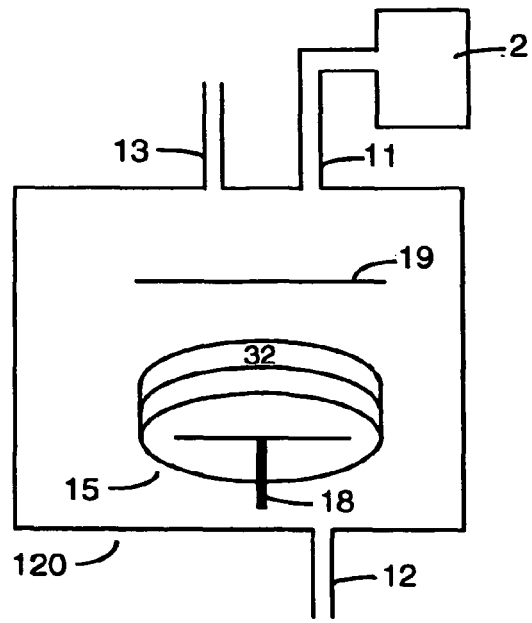
FIG. 3 shows an organic removal/silylation chamber according to an embodiment of the invention.
Figure 6:
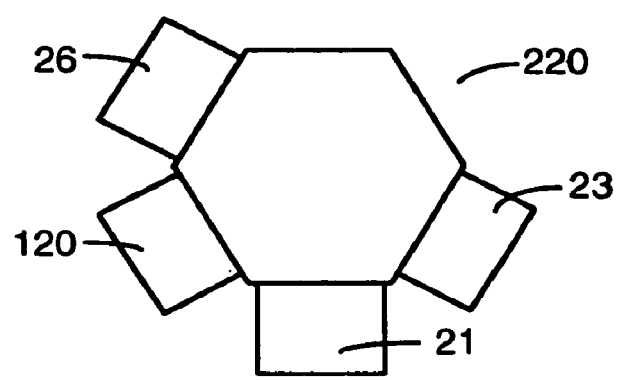
FIG. 6 shows a cluster tool including an organic removal/silylation chamber such as that shown in FIG. 2 according to an embodiment of the invention.

FIG. 6 shows a cluster tool 220 including wafer in/out module 21 and an organic removal/silylation chamber such as organic removal/silylation chamber 120 of FIG. 3, according to an embodiment of the invention. Cluster tool 240 may also include additional chambers such as a PECVD or spin-on deposition chamber for depositing a low-k layer or a cap layer. Transfer chamber 28 includes a wafer handling mechanism such as a robot 29 that can move one or more wafers (not shown) in cluster tool 220. According to an embodiment of the invention, one or more wafers with a low-k material including sacrificial organic material is introduced into cluster tool 220 through wafer in/out module 21. Robot 29 moves the wafer from wafer in/out module 21 to organic removal/silylation chamber 120. Sacrificial material is removed by an oxygen plasma in organic removal/silylation chamber 120. After the sacrificial material has been removed, a silylating agent is introduced into organic removal/silylation chamber 120, rendering the low-k film hydrophobic. Subsequently, the wafer is moved by robot 29 through transfer chamber 28 to another processing module on the cluster tool such as first process module 23 or second process module 26 for further processing, or to wafer in/out module 21.

According to an embodiment of the invention, cluster tool 220 of FIG. 6 includes wafer in/out module 21, organic removal/silylation chamber 120, and first process module 23. First process module 23 may be, for example, a PECVD deposition module or a spin-on deposition module for depositing a low-k layer or a cap layer, or other module.

In an embodiment of the invention, first process module 23 is a PECVD module. One or more wafers are introduced into cluster tool 220 through wafer in/out module 21. Robot 29 moves a wafer from wafer in/out module 21 through transfer chamber 28 to first process module 23, where a low-k layer having a sacrificial organic material is deposited by PECVD methods. Robot 29 moves the wafer from first process module 23 to organic removal/silylation chamber 120. Sacrificial material is removed by an oxygen plasma in organic removal/silylation chamber 120. After the sacrificial material has been removed, a silylating agent is introduced into organic removal/silylation chamber 120, rendering the low-k film hydrophobic. Subsequently, the wafer may be moved by robot 29 through transfer chamber 28 to another processing module on the cluster tool such as second process module 26, or to wafer in/out module 21. Alternately, robot 29 may move the wafer through transfer chamber 28 back to first process module 23, where a cap layer may be deposited by PECVD methods.

According to an embodiment of the invention, cluster tool 220 of FIG. 6 includes wafer in/out module 21, organic removal/silylation chamber 120, first process module 23, and second process module 26. First process module 23 may be a spin-on deposition chamber or PECVD deposition chamber for depositing a low-k layer or a cap layer, or other module. Similarly, second process module 26 may be a spin-on deposition chamber or PECVD chamber for depositing a low-k layer or a cap layer, or other module. In an embodiment of the invention, first process module 23 is a PECVD deposition chamber used for deposition of a low-k layer, and second process module 26 is a PECVD deposition chamber used for cap deposition.

Robot 29 moves a wafer from wafer in/out module 21 through transfer chamber 28 to first process module 23, where a low-k dielectric film is deposited using PECVD methods. After deposition, robot 29 moves the wafers through transfer chamber 28 to organic removal/silylation chamber 120. Sacrificial material is removed by an oxygen plasma in organic removal/silylation chamber 120. After the sacrificial material has been removed, a silylating agent is introduced into organic removal/silylation chamber 120, rendering the low-k film hydrophobic. If a cap layer is desired, robot 29 moves the wafer through transfer chamber 28 to second process module 26, where a cap layer is deposited using PECVD methods. Alternately, a single chamber may be used to deposit a low-k layer and a cap layer, as described above. Subsequently, the wafer or wafers may be moved by robot 29 through transfer chamber 28 to another processing module on the cluster tool (not shown) or to wafer in/out module 21.

In another embodiment, a cluster too may include one or more PVD chambers as well as silylation chamber, for example to perform pre-PVD repair of the dielectric layer.

FIGS. 7A-7G show a method of processing a substrate including a low-k dielectric layer according to an embodiment of the invention. FIGS. 7A-7G demonstrate patterning, etching, ashing, and repairing wafer 15 with low-k dielectric layer 32. Alternately, other processes may be performed on low-k dielectric layer 32. Some well-known steps in the described process have been omitted for simplicity; for example, the soft-bake and hard-bake steps.

Performing silylation after ashing prevents significant increase in the dielectric constant of the films while allowing for a high ash rate. Although the post-ash silylation step requires additional wafer processing time after ashing, it may allow a post-deposition silylation step to be omitted, leaving the total processing time substantially unchanged. Typically, after the low-k dielectric material is deposited, a silylation process is performed in order to replace hydrophilic bonds with hydrophobic bonds. This ensures that the low-k material has the optimum dielectric constant. However, when a post-ash silylation process is used, the post-deposition silylation step may be omitted.

Figure 7A:
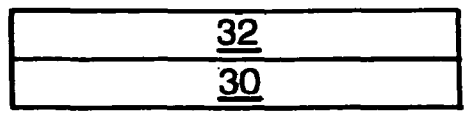
FIGS. 7A to 7G illustrate a process which may be performed on an ash/silylation chamber such as that shown in FIG. 1 by which silylation may be used to repair damage to a low-k dielectric layer caused by ashing.

Low-k dielectric layer 32 is formed on a substrate 30, as shown in FIG. 7A. Substrate 30 may be a wafer, a layer on a wafer, or other appropriate substrate. Low-k dielectric layer 32 may be patterned using lithography. Different types of lithography may be used, depending on the size of features to be patterned. For example, optical lithography may be used, using light in the visible spectrum. Alternately, electromagnetic radiation with a wavelength falling outside of the visible spectrum may also be used. For example, deep UV, extreme UV, or x-ray lithography may be used. Alternately, a charged particle beam may be used for lithography such as e-beam lithography or ion beam lithography.

Figure 7B:
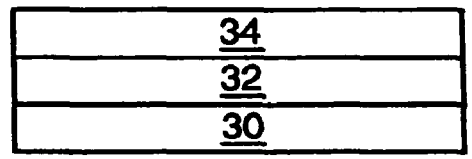

Photoresist layer 34 is formed on low-k dielectric layer 32, as shown in FIG. 7B. Alternately, there may be additional layers disposed between low-k dielectric layer 32 and photoresist layer 34. Photoresist layer 34 may be spun-on, according to well-known methods. The type of photoresist material used for photoresist layer 34 depends on the type of lithography. For example, when performing deep UV lithography, one of the deep UV photoresists provided by the Shipley Company, such as 1811, may be used.

Figure 7C:
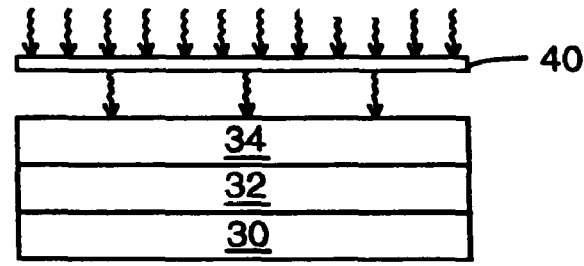
Figure 7D:
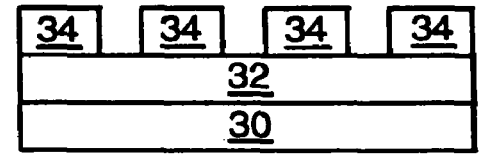

As FIG. 7C shows, for an example where optical lithography is used, photoresist layer 34 may exposed by shining light on selected portions of photoresist layer 34 through a mask 40. For a positive photoresist layer, as shown in FIG. 7C, portions of photoresist layer 34 that are exposed to light are removed by a developer, while portions of photoresist layer 34 that are not exposed to light are not removed by a developer. FIG. 7D shows the structure after photoresist layer 34 has been developed.

Figure 7E:
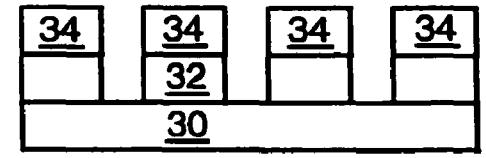

Low-k dielectric layer 32 may be etched, as shown in FIG. 7E. FIG. 7E shows a substantially anisotropic etch that is very selective of low-k dielectric layer 32 compared to photoresist layer 34.

Figure 7F:
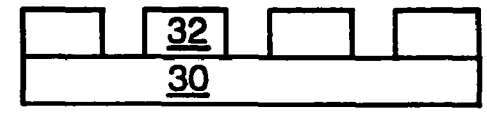

In FIG. 7F, remaining portions of photoresist layer 34 are substantially removed by an ash process, described above. As described above, the ash process may damage low-k dielectric layer 32, for example, by forming hydrophilic bonds such as Si—OH.

Figure 7G:
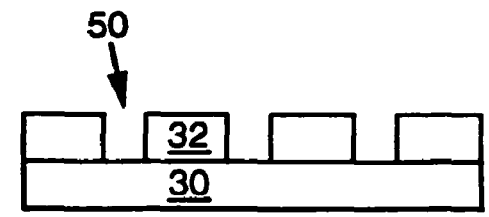

In FIG. 7G, a silylating agent 50 is provided in order to repair damaged bonds, for example to replace hydrophilic Si—OH bonds with hydrophobic Si—O—Si—$(CH_3)_3$ or Si—O—Si$(CH_3)_2$-O—Si bonds. The silylating agent used may be, for example, hexamethyldisilazane (DS), dichlorodimethylsilane (DCDMS), chlorotrimethylsilane (CTMS), acetaldehyde, or combinations thereof.

Table 1 below shows the capacitance of a silicalite film according to an embodiment of the present invention after ashing and after silylation. Ash recipe 1 included an oxygen-containing plasma, while ash recipes 2 and 3 included reducing plasmas. $C_O$ is the initial capacitance of the film, $C_a$ is the capacitance of the film after ashing, $C_{s1}$ is the film capacitance after a silylation has been performed to repair damage to the low-k film, and $C_{s2}$ is the film capacitance after an additional post-etch clean in Ashland Chemical's NE-14 and an additional silylation step using HDMS. All capacitances are in picofarads.

Table 1 illustrates that each film underwent a significant increase in capacitance (and therefore dielectric constant) as a result of the ashing process. Further, Table 1 illustrates that post-ash silylation is an effective method of decreasing dielectric constant.

TABLE 1

| Wafer | Co | Ash recipe | $C_a$ | $C_{s1}$ | $C_{s2}$ |
|---|---|---|---|---|---|
| 1 | 41.67 | 1 | 61.56 | 42.13 | 41.13 |
| 2 | 67.29 | 2 | 130.47 | 76.34 | 72.15 |
| 3 | 52.29 | 2 | 91.14 | 57.71 | 54.83 |
| 4 | 44.95 | 3 | 150.14 | 50.16 | 47.67 |

The results displayed in Table 1 were not obtained using an optimized process and the silylating process was not performed in-situ; better results may be obtained by optimizing the process used.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of repairing damage to a low-k dielectric layer, said layer having damage from one or more previously preformed integrated circuit fabrication processes, said method comprising performing a silylating process to repair at least some of the damage in the dielectric low-k dielectric layer.

2. The method of claim 1 wherein the damage in the layer comprises hydrophilic bonds in the low-k dielectric layer.

3. The method of claim 2, wherein said hydrophilic bonds include Si—OH.

4. The method of claim 2, wherein said silylating process comprises replacing at least some hydrophilic bonds with hydrophobic bonds.

5. The method of claim 4, wherein said hydrophobic bonds include Si—O—Si—$(CH_3)_3$ bonds.

6. The method of claim 4, wherein said hydrophobic bonds include Si—O—Si$(CH_3)_2$-O—Si bonds.

7. The method of claim 1 wherein the damages in the layer comprises depleted methyl sites within the layer.

8. The method of claim 1, wherein said low-k dielectric layer includes a material chosen from the group consisting of aerogel, xerogel, silicalite, dendrite-based porous glass, mesoporous silica, and carbon-doped oxide.

9. The method of claim 1, wherein said low-k dielectric layer includes a silsesquioxane.

10. The method of claim 1 wherein the silylating process is performed after the dielectric layer is exposed to an oxidizing environment.

11. The method of claim 1 wherein the silylating process is performed after the dielectric layer is exposed to a reducing environment.

12. The method of claim 1, wherein performing said silylating process comprises providing a silylating agent.

13. The method of claim 12, wherein said silylating agent is chosen from the group consisting of hexamethyldisilazane (HMDS), dichlorodimethylsilane (DCDMS), chlorotrimethylsilane (CTMS), and acetaldehyde.

14. The method of claim 1 wherein the silylating process is performed after a chemical mechanical planarization process.

15. The method of claim 1 wherein the fabrication process and the silylating process are performed in the same chamber.

16. The method of claim 1 wherein the silylating process is performed between dielectric etch of a feature and PVD deposition of a barrier layer in the feature.

17. The method of claim 1 wherein the silylating process is performed after a clean process.

18. The method of claim 1 wherein the silylating process is performed after chemical mechanical planarization.

19. The method of claim 1 wherein the silylating process is performed after a deposition process.

20. The method of claim 19 where the silylating process is performed after a physical vapor deposition process.

21. The method of claim 19 wherein the silylating process is performed after, photoresist ashing, sacrificial layer removal, cure and dielectric etch processes.

* * * * *